United States Patent [19]

Osaka

[11] Patent Number: 5,051,866
[45] Date of Patent: Sep. 24, 1991

[54] POWER CIRCUIT DEVICE FOR AN IMAGE-FORMING APPARATUS

[75] Inventor: Haruya Osaka, Osaka, Japan

[73] Assignee: Mita Industrial Co., Ltd., Osaka, Japan

[21] Appl. No.: 441,288

[22] Filed: Nov. 27, 1989

[30] Foreign Application Priority Data

Nov. 28, 1988 [JP] Japan ............................ 63-154603

[51] Int. Cl.[5] ..................... H05K 7/20; G03B 27/52
[52] U.S. Cl. ................................. 361/388; 165/80.3; 355/30; 355/200; 361/384
[58] Field of Search ................. 355/30, 200; 165/80.2, 165/80.3, 185; 361/383, 384, 386, 387, 388

[56] References Cited

U.S. PATENT DOCUMENTS

| | | | |
|---|---|---|---|
| 4,645,333 | 2/1987 | Watanabe | 361/384 |
| 4,674,005 | 6/1987 | Lacz | 361/388 |
| 4,899,255 | 2/1990 | Case | 361/386 |
| 4,905,123 | 2/1990 | Windle | 361/386 |
| 4,911,231 | 3/1990 | Horne | 361/384 |

OTHER PUBLICATIONS

Color Recorder, Nemoto, Japanese abstract, #62-152241, 6/18/87 filed, 12,22/88, patented.

*Primary Examiner*—Gerald P. Tolin
*Attorney, Agent, or Firm*—Antonelli, Terry, Stout & Kraus

[57] ABSTRACT

A radiator plate is formed in a slender shape of which the length is such that a plurality of heat emitting elements are attached to the radiator plate arranged substantially in one row at necessary spatial intervals. The printed circuit board is also formed in a slender shape of which length corresponds to the length of the radiator plate. The power input unit is disposed at one longitudinal end of the slender printed circuit board, and the power output unit is disposed at the other longitudinal end of the slender printed circuit board. Accordingly, the power circuit device may be incorporated in apparatus such as an electrophotographic copying apparatus within a vacant space therein, making efficient use of such space. Thus, the apparatus requires no special space for housing the power circuit device. This enables reducing of the dye of the apparatus in its entirety. Further, the power input unit and the power output unit are sufficiently separated from each other on the printed circuit board. This reduces the interference of the power input unit and the power output unit with each other, resulting in reduction in power noise.

4 Claims, 4 Drawing Sheets

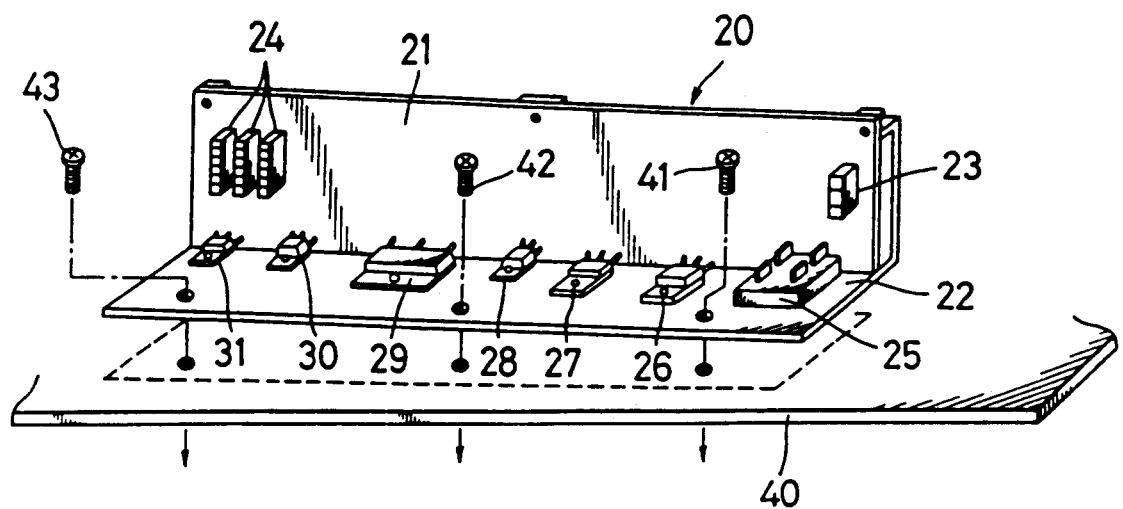
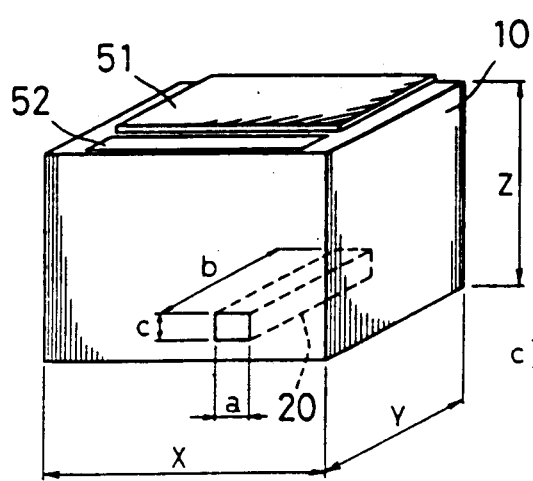
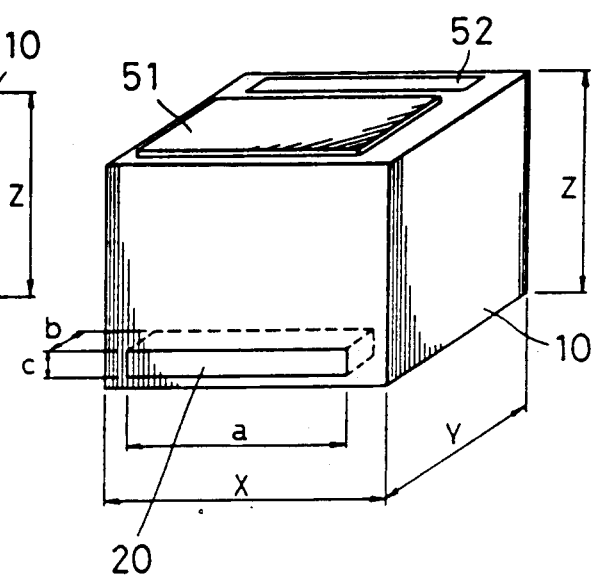

POWER CIRCUIT DEVICE FOR AN IMAGE-FORMING APPARATUS

BACKGROUND OF THE INVENTION

The present invention relates to a power circuit device, and more particularly to a power circuit device suitable to be suitably used for an image forming apparatus such as an electrophotographic copying apparatus or the like.

A power circuit in an electrophotographic copying apparatus generally includes elements which emit heat more or less (hereinafter referred to heat emitting elements) such as resistors, transistors, diodes and the like. Thus, radiator plates are often required.

The power circuit is housed in a limited space in an electrophotographic copying apparatus. Accordingly, the power circuit is apt to be designed such that the printed circuit board thereof is reduced in area. To enhance the radiation effect, the radiator plates are suitably disposed on the printed circuit board at required positions thereof, and the heat emitting elements are attached to the radiator plates. As a result, the power circuit device may be reduced in volume, and the radiation effect may be improved.

A conventional typical power circuit device is shown in FIG. 5. In FIG. 5, radiator plates 2, 3, having great heat capacity, are respectively disposed at both lateral sides of a printed circuit board 1. Some heat emitting elements 4a, 4b, 4c, etc., such as power transistors and the like, are attached to the radiator plates 2, 3.

As shown above, the conventional power circuit device has been designed based on the concept that it is the best to reduce the entire volume of the power circuit device to make the same in a small size, thereby to enhance the general-purpose properties thereof.

In designing the power circuit, when it is desired to design an efficient circuit, the printed circuit board is generally made in the form of a regular square or a rectangle, close to a regular square. When incorporating such a power circuit device in an electrophotographic copying apparatus, a custom space for housing the power circuit device should be formed in the apparatus, since the power circuit device is made in the form of a cube or a rectangular parallelpiped, close to a cube, even though the power circuit device is made in a small size. However, the electrophotographic copying apparatus includes a number of mechanisms required for image forming processing. It has been, therefore, difficult to provide in a electrophotographic copying apparatus a large space for housing the power circuit device, with the layout of such image forming processing mechanisms taken into consideration. To obtain a space for housing the power circuit device in the electrophotographic copying apparatus, it is inevitably required to increase the volume of the electrophotographic copying apparatus. This presents the problem that the apparatus is increased in size.

In this connection, it may be proposed to externally attach the power circuit device to the electrophotographic copying apparatus. For example, a projecting portion 5, as shown in FIG. 6, may be disposed at the back of an electrophotographic copying apparatus 6. To improve the radiation effect of the power circuit device, the projecting portion 5 is provided in the wall surface thereof with radiating slits 7.

The arrangement including such a projecting portion 5 presents the problem that the electrophotographic copying apparatus requires a wider installation space in a room.

In the power circuit device, the radiation effect should be enhanced even though the entire volume of the device is small. Accordingly, thick radiator plates 2, 3 having great heat capacity should be disposed. With the increase in the number of heat emitting elements, the capacity or volume of the radiator plates must inevitably be increased. Accordingly, the radiator plates become expensive, resulting in an increase in cost of the power circuit device.

The electrophotographic copying apparatus incorporates complicated image forming processing mechanisms. However, some gaps are locally present in the apparatus. Such gaps are generally long and narrow vacant spaces. The conventional power circuit device is made in the form of a cube or a rectangular parallelpiped, close to a cube even though it is made in a small size. Accordingly, the conventional power circuit device cannot be housed in any of these long and narrow vacant spaces.

Further, if the power circuit device is to be made slender, it is difficult to design the pattern of the printed circuit board. Accordingly, such a slender power circuit device has been conventionally regarded as a device full of faults by those who are skilled in the field of designing of power circuit devices.

Further, when the printed circuit board is long, an automatic assembling apparatus should move in a wider range for securing and wiring heat emitting elements to the printed circuit board. This results in increase in size and cost of the automatic assembling apparatus.

Thus, since the slender power circuit device has many faults and no advantages, those skilled in the art, or the persons concerned, have not taken such a device into consideration.

However, when the power circuit device is not regarded as a single device, but is considered from the viewpoint of a component element to be incorporated in an electrophotographic copying apparatus, a slender power circuit device may be disposed in the electrophotographic copying apparatus within one of the vacant spaces therein, and effectively used without requiring a special place. This results in reduction in the size of the electrophotographic copying apparatus. The inventor of the present invention has taken notice of the foregoing and, based on such a concept, he has completed the present invention.

It is an object of the present invention to provide a high-performance power circuit device which can be incorporated in apparatus within surplus spaces therein, thereby making efficient use of vacant spaces in the apparatus.

SUMMARY OF THE INVENTION

In the power circuit device according to the present invention, the power input unit, the power output unit and a plurality of heat emitting elements requiring a radiator plate are wired to a printed circuit board. The radiator plate is formed in a slender shape of which length is such that a plurality of heat emitting elements are attached to the radiator plate at necessary spatial intervals. The printed circuit board is formed in a slender shape the length of which corresponds to the length of the radiator plate. The power input unit is disposed at one longitudinal end of the slender printed circuit board, and the power output unit is disposed at the other longitudinal end of the slender printed circuit board, so that the power input unit and the power output unit are sufficiently separated from each other.

The above power circuit device is generally slender, so that the power circuit device may be incorporated in apparatus such as an electrophotographic copying apparatus or the like with a vacant space therein, making efficient use of such vacant space. Moreover, since the radiator plate included in the power circuit device is also slender, a plurality of heat emitting elements requiring the radiator plate may be attached thereto as arranged substantially in one row.

Accordingly, a vacant space in apparatus in which the power circuit device is incorporated, may be used efficiently. Thus, the apparatus requires no special space for housing the power circuit device, enabling the apparatus to be reduced in size in its entirety.

Further, the printed circuit board is formed in a slender shape fit for the radiator plate. Accordingly, the power input unit and the power output unit disposed at the printed circuit board may be sufficiently separated from each other at both ends of the board. Since the power input unit and the power output unit are sufficiently separated from each other on the circuit board, the interference of the output side and the input side with each other in the circuit may be reduced, resulting in reduction in power noise.

In the power circuit device of the present invention, the radiator plate may be attached directly to the body of apparatus. In this case, the heat of the radiator plate may be efficiently transmitted to the apparatus body. Thus, a thin radiator plate may be used.

The above features of the present invention will be apparent from the following description with reference to the attached drawings.

BRIEF DESCRIPTION OF THE DRAWINGS

FIG. 1 is a perspective view of a power circuit device in accordance with an embodiment of the present invention, illustrating how the power circuit device is attached to the base of apparatus;

FIG. 2 schematically shows the space in an electrophotographic copying apparatus which is occupied by the power circuit device of the present invention installed in the apparatus;

DESCRIPTION OF THE PREFERRED EMBODIMENT

Figure 3A:
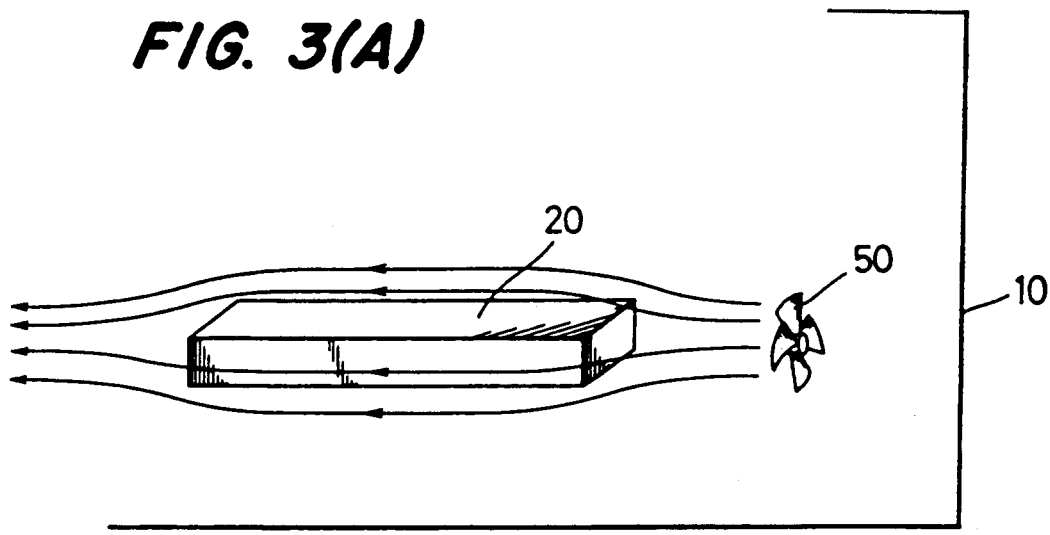
FIG. 3 schematically illustrates an air cooling action exerted on the power circuit device.

The following description will discuss an embodiment of the present invention with a power circuit device in an electrophotographic copying apparatus taken as an example.

Briefly speaking, this embodiment is characterized in that the power circuit device is made in the form of a slender shape in its entirety. That is, the power circuit device has, as will be discussed later, a printed circuit board and a radiator plate, both of which are formed in a slender shape.

The following description will discuss a specific example of the present invention with reference to FIG. 1.

A power circuit device 20 includes a slender printed circuit board 21 and a slender radiator plate 22 which is disposed along one of the long edges of the printed circuit board 21 and at a right angle thereto. An input connector 23 is disposed on the printed circuit board 21 at one longitudinal end thereof, and output connectors 24 are disposed on the printed circuit board 21 at the other longitudinal end thereof. Thus, the input connector 23 and the output connectors 24 are separated from each other on the slender printed circuit board 21 at both longitudinal ends thereof. This prevents the input wires and the output wires from getting close to each other in the inside wiring of the electrophotographic copying apparatus or in the wiring pattern of the printed circuit board 21. This reduces power noise to improve the noise-resisting properties of the electrophotographic copying apparatus.

Attached to the slender radiator plate 22 are heat emitting elements such as an AC input diode bridge 25, switching transistors 26, 27, 28, a hybrid IC 29, output transistors 30, 31 and the like which are arranged in one row at necessary spatial intervals. In other words, the radiator plate 22 has a sufficient length such that a plurality of heat emitting elements 25 to 31 requiring the radiator plate 22 may be attached as arranged in one row, and the radiator plate 22 has a minimized narrow width. Accordingly, the power circuit device 20 is formed, in its entirety, in a slender shape having an L-shape section.

As shown in FIG. 1, the radiator plate 22 may be attached directly to a base 40 of an apparatus with screws 41, 42, 43. Accordingly, the heat of the radiator plate 22 is efficiently transmitted to the base 40. This enables the radiator plate 22 to be economically made of an aluminium plate or the like of which thickness is smaller than a conventional one. Thus, a power circuit device having a great capacity may be made with less material cost.

In the power circuit device 20 above-mentioned, the printed circuit board 21 may be made by longitudinally connecting a plurality of, for example two or three, printed circuit boards, instead of the use of a single slender board in FIG. 1.

As thus described, the power circuit device 20 in accordance with this embodiment is intentionally made in a slender shape, so that the power circuit device 20 may be housed in one of slender gaps, i.e., slender vacant spaces, locally present in the body 10 of the electrophotographic copying apparatus, as schematically shown in FIG. 2 (A) or FIG. 2 (B). In FIG. 2 (A) and (B), a document cover and an operation and display panel are respectively designated by reference numerals 51 and 52.

Since the power circuit device 20 may be housed in a slender vacant space, a special space for housing the power circuit device 20 is not additionally required. Thus, the body 10 of the electrophotographic copying apparatus may be reduced in size in its entirety. Further, if the circuit becomes faulty and requires repair, the operator may open the lateral plate and readily remove the power circuit device 20.

The size of the power circuit device 20 will be more specifically described. It is now supposed that the electrophotographic copying apparatus has a width X, a depth Y and a height Z, and the power circuit device 20 has a width a, a depth b and a height c. In the example in FIG. 2 (A), it is preferable that a/X is in a range from 1/5 to 1/10, b/Y is in a range from 4/5 to ½, and c/Z is in a range from ½ to 1/10. In the example in FIG. 2 (B), it is preferable that a/X is in a range from 4/5 to ½, b/Y is in a range from 1/5 to 1/10, and c/Z is in a range from ½ to 1/10. These numeric values may be determined based on the sizes of actual vacant spaces present inside of electrophotographic copying apparatus available in the market and the cooling capacity thereof.

Figure 3B:
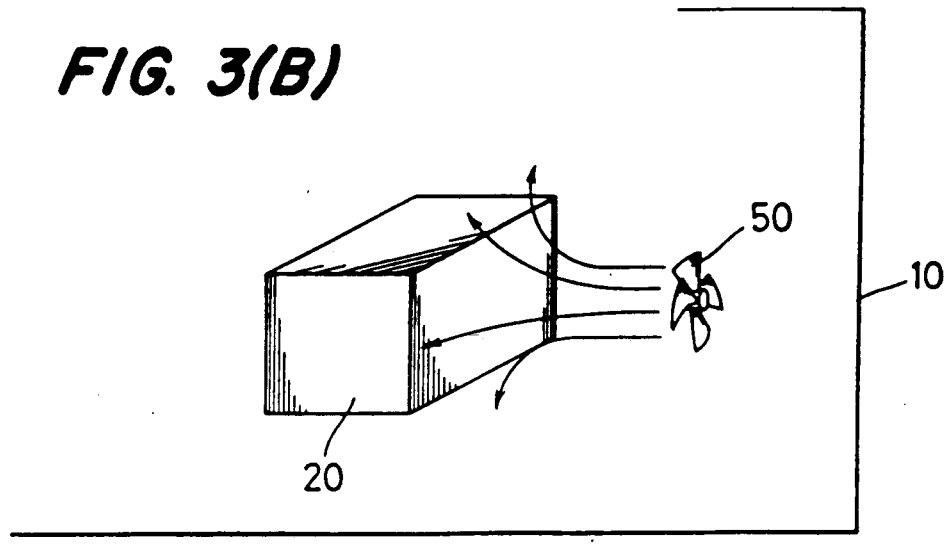

When the power circuit device requires forced air cooling, air for forced forcible air cooling may be blown in the longitudinal direction of the power circuit device 20 by a fan 50 (See FIG. 3 (A)). Since the power circuit device 20 is slender, the cooling effect may be enhanced. If the power circuit device is made in the form of a cube as conventionally done, the air is screened by the power circuit device to prevent the air from efficiently flowing (See FIG. 3 (B)).

Figure 4A:
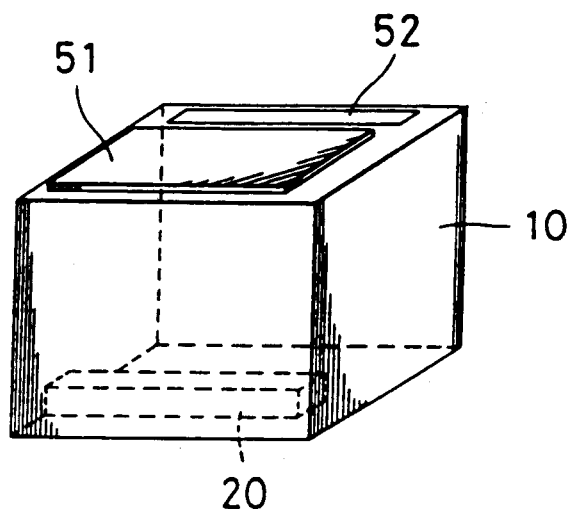
FIG. 4 schematically illustrates another example of the installation of the power circuit device.
Figure 4B:
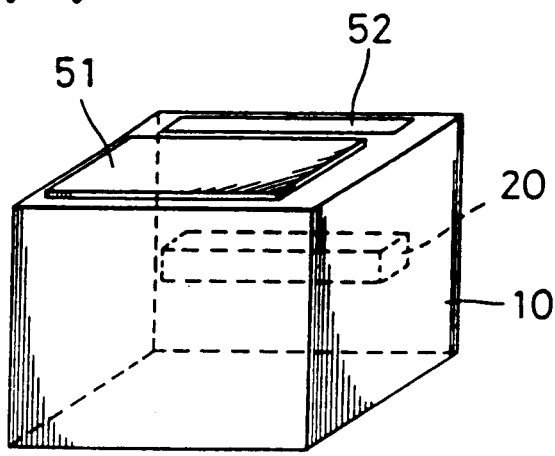
Figure 5:
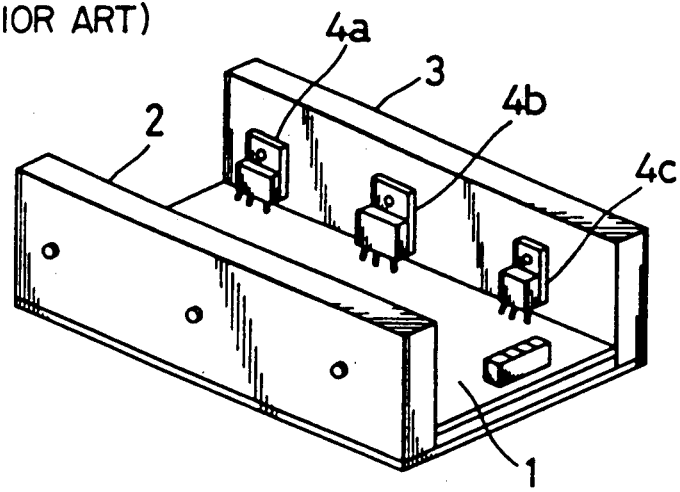
FIG. 5 is a perspective view of a conventional power circuit device.
Figure 6:
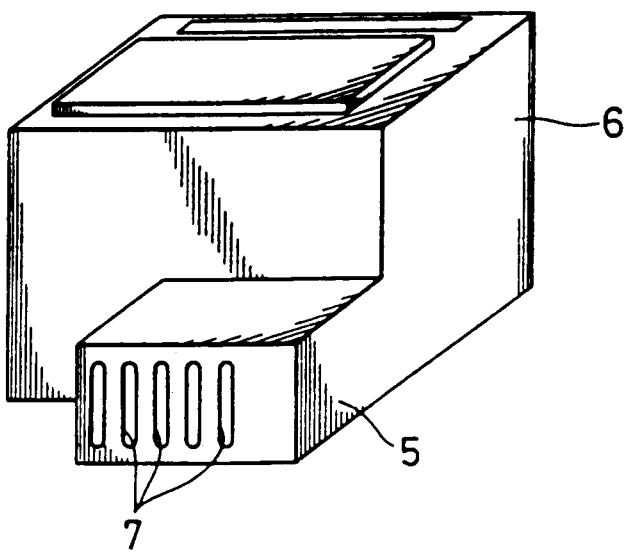
FIG. 6 is a schematic view of a conventional power circuit device externally attached to the body of an electrophotographic copying apparatus.

The present invention has been described in detail with reference to the attached drawings. However, the present invention should not be limited to the specific embodiment above-mentioned. For example, the positions where the power circuit device 20 is incorporated in the electrophotographic copying apparatus, are not limited to those in FIG. 2 (A) and (B). The power circuit device may be disposed on the bottom plate of the electrophotographic copying apparatus as shown in FIG. 4 (A), or disposed inside of the apparatus as shown in FIG. 4 (B). When the power circuit device is disposed on the bottom of the electrophotographic copying apparatus as shown in FIG. 4 (A), the effect of radiating the heat to the outside of the apparatus is particularly excellent. It should be understood that the present invention may be varied or modified in various manners without departing from the scope of the invention.

What we claim is:

1. In an image-forming apparatus including a housing body; a plurality of image-forming and processing mechanisms positioned within the housing body with elongated narrow spaces therebetween; and a power circuit device for providing power to the image-forming and processing mechanisms, the power circuit device including an input unit a plurality of heating emitting elements, an output unit, a printed circuit board having the input unit and the output unit mounted thereon, and a radiator plate, the improvement wherein:

said printed circuit board comprises an elongated, slender, flat board member;

said radiator plate comprises an elongated, slender, flat radiator member having a length substantially equal to the length of said board member and mounted with one longitudinal edge of said radiator member adjacent one longitudinal edge of said board member and with said flat radiator member extending at substantially a right angle to said flat board member to form an elongated, slender power circuit device positioned within one of the elongated, narrow spaces; and said heat emitting elements are mounted on said radiator member for radiating heat emitted by the heat emitting elements, whereby the power circuit device is provided in the housing body without enlarging the housing body substantially beyond the size required to house the image-forming and processing mechanisms.

2. The improvement of claim 1, wherein said radiator plate is attached directly to the image-forming apparatus housing body.

3. The improvement of claim 1, wherein said input unit is mounted adjacent a first end of said elongated board member and said output unit is mounted adjacent a second end of said elongated board member.

4. The improvement of claim 1, wherein said heat emitting elements are aligned in a single row on said elongated slender radiator member.

* * * * *